United States Patent
Lu et al.

(10) Patent No.: US 11,009,336 B2
(45) Date of Patent: May 18, 2021

(54) METHOD FOR WAVEFRONT MEASUREMENT OF OPTICAL IMAGING SYSTEM BASED ON GRATING SHEARING INTERFEROMETRY

(71) Applicant: Shanghai Institute of Optics And Fine Mechanics, Chinese Academy of Sciences, Shanghai (CN)

(72) Inventors: Yunjun Lu, Shanghai (CN); Feng Tang, Shanghai (CN); Xiangzhao Wang, Shanghai (CN)

(73) Assignee: Shanghai Institute of Optics And Fine Mechanics, Chinese Academy of Sciences

( * ) Notice: Subject to any disclaimer, the term of this patent is extended or adjusted under 35 U.S.C. 154(b) by 0 days.

(21) Appl. No.: 16/684,990

(22) Filed: Nov. 15, 2019

(65) Prior Publication Data
US 2020/0292296 A1 Sep. 17, 2020

(30) Foreign Application Priority Data

Mar. 12, 2019 (CN) .......................... 201910183243.6

(51) Int. Cl.
*G01B 9/02* (2006.01)
*G01J 9/02* (2006.01)
*G01M 11/02* (2006.01)

(52) U.S. Cl.
CPC ........ *G01B 9/02034* (2013.01); *G01J 9/0215* (2013.01); *G01M 11/0271* (2013.01)

(58) Field of Classification Search
CPC ............ G01B 9/02034; G01B 9/02098; G01B 2290/30; G01J 9/0215; G01J 2009/0219; G01M 11/0207; G01M 11/0271
See application file for complete search history.

(56) References Cited

U.S. PATENT DOCUMENTS

| | | | | |
|---|---|---|---|---|
| 7,088,458 B1* | 8/2006 | Wegmann | ................. | G01J 9/02 |
| | | | | 356/124 |
| 7,336,371 B1* | 2/2008 | Haidner | ............. | G01M 11/0271 |
| | | | | 356/515 |
| 2005/0007602 A1* | 1/2005 | Haidner | .................... | G01J 9/04 |
| | | | | 356/521 |

(Continued)

FOREIGN PATENT DOCUMENTS

CN 104111120 A 10/2014

OTHER PUBLICATIONS

U.S. Appl. No. 16/685,159, filed Nov. 15, 2019, Lu, Yunjun et al.
J. Braat et al., "Improved Ronchi test with extended source," Journal of the Optical Society of America A., vol. 16, No. 1, pp. 131-140 (1999).
Yucong Zhu et al., "Shearing Interferometry for at wavelength wavefront measurement of extreme-ultraviolet lithography projection optics," Japanese Journal of Applied Physics, vol. 42, pp. 5844-5847 (2003).
Yucong Zhu et al., "Method for designing phase-calculation algorithms for two-dimensional grating phase shifting interferometry," Applied Optics, vol. 50, No. 18, pp. 2815-2822 (Jun. 20, 2011).

*Primary Examiner* — Michael A Lyons
(74) *Attorney, Agent, or Firm* — Mei & Mark LLP; Manni Li

(57) ABSTRACT

A method for wavefront measurement of optical imaging system based on grating shearing interferometry, the grating shearing interferometer comprising: a light source and illumination system, an optical imaging system to be tested, a one-dimensional diffraction grating plate, a two-dimensional diffraction grating plate, a two-dimensional photoelectric sensor and a computing unit. The one-dimensional diffraction grating plate and the two-dimensional diffraction grating plate are respectively placed on the object side and (Continued)

the image side of the optical imaging system to be tested. By collecting N sets of interferograms with a $$\frac{2\pi}{N}$$

phase-shifting interval (where, $$N = 2\left(\text{fix}\left(\frac{\text{ceil}(1/s)}{2}\right) + 1\right),$$

s is the shear ratio of the grating shearing interferometer), combined with a certain phase retrieval algorithm, the influence of all high-order diffraction beams on the phase retrieval accuracy is eliminated, and finally the wavefront measurement accuracy for the optical imaging system is improved.

2 Claims, 3 Drawing Sheets

(56) References Cited

U.S. PATENT DOCUMENTS

| | | | |
|---|---|---|---|
| 2006/0001861 A1* | 1/2006 | Wegmann | G03F 7/706 356/124 |
| 2017/0131176 A1* | 5/2017 | Dai | G03F 7/706 |
| 2020/0292384 A1* | 9/2020 | Lu | G01J 3/18 |

* cited by examiner

METHOD FOR WAVEFRONT MEASUREMENT OF OPTICAL IMAGING SYSTEM BASED ON GRATING SHEARING INTERFEROMETRY

CROSS-REFERENCE TO RELATED APPLICATION

The subject application claims priority on Chinese patent application no. CN 201910183243.6 filed on Mar. 12, 2019 in China. The contents and subject matter of the Chinese priority application is incorporated herein by reference.

FIELD OF TECHNOLOGY

The present invention relates to optical measurement, particularly, a phase retrieval algorithm and device for wavefront measurement of the projection lens of lithography or other optical imaging system that are based on grating shearing interferometry.

BACKGROUND ART

The grating shearing interferometer has the advantages of common path, no need for extra ideal reference, high precision, high sensitivity, and simple structure. The phase-shifting interferometry is introduced, where a series of interferograms with different phase-shifting amounts are acquired by moving the grating laterally, and then the wavefront aberration of the system under test is obtained.

For shearing interferometer, the high-precision phase retrieval is the promise for obtaining high-precision wavefront measurement.

Unlike the two-beam interferometry, in the interference field of the shearing interferometer, due to the diffraction of the grating at the object plane, there are multistage high-order diffraction beams, and interference can occur between these high-order diffraction beams. Although the coherence of the light source is modulated by using an incoherent light source and a grating at the object plane, the interference between the high-order diffraction beams is suppressed, and the interference field is simplified to some extent. However, interference of high-order other than ±1st-order beams and 0th-order beam still exists on the receiving surface of the detector, which seriously reduces the phase retrieval precision.

J. Braat et al., "Improved Ronchi test with extended source," Journal of the Optical Society of America A., Vol. 16, No. 1, pp:131-140 (1999), proposes a grating shearing interferometer improved by an extended light source, which uses only the interference between ±1st- and 0th-order diffraction beams for phase retrieval, without considering the influence of high diffraction orders. As the numerical aperture of the optical system to be tested continues to increase, more and more high-order diffraction beams occur in the system. When the method is used for phase retrieval, a large number of system errors is introduced, which seriously reduces the phase retrieval accuracy.

Yucong Zhu et al., "Shearing Interferometry for at wavelength wavefront measurement of extreme-ultraviolet lithography projection optics," Jpn. J. Appl. Phys., 42, pp. 5844-5847 (2003), discloses filtering high-order diffraction beams by using a double-window mask to ensure that only 1st- and 0th-order beams participate in the two-beam interference. The disadvantage of the method is that when the shear direction or the shear ratio is changed, the mask filter needs to be replaced synchronously, resulting in inconvenient measurement operation and increasing the complexity of the mechanical structure.

Both Yucong Zhu et al., "Method for designing phase-calculation algorithms for two-dimensional grating phase shifting interferometry," Applied Optics, 50(18), pp.2815-2822 2011) and Chinese Invention Patent No. 201410360070.8 use interference between ±1st- and 0th-order beams for phase retrieval. The commonality of the two is that the phase retrieval accuracy is improved to some extent by eliminating the influence of ±3th- and ±5th-order diffraction beams on the phase retrieval through a certain algorithm. However, for the presence of ±7th- and higher-order diffraction beams, the method still cannot eliminate the effects of these high-order diffraction beams.

For measurement system of shearing interferometer with large numerical aperture, there is no grating shearing interferometer system without high-order diffraction beams which is simple in structure and convenient to operate, and there is also no phase retrieval algorithm and method for eliminating high-order diffraction beams.

SUMMARY OF THE INVENTION

The object of the present invention is to overcome the deficiencies of the prior art, and to provide a method that can eliminate the influence of all high-order diffraction beams in the grating shearing interferometer system except the ±1st-order diffraction beams, and completely eliminate the system error in phase retrieval process. The method of the present invention can determine the required phase-shifting step number according to the numerical aperture of the optical system to be tested or the shear ratio of the shearing interferometer system, and has the characteristics of high phase retrieval precision, large measurable range of numerical aperture, and adjustable shear ratio of the grating interferometer.

To achieve the above object, the technical solution of the present invention is as follows: A method for wavefront measurement of optical imaging system based on grating shearing interferometry, the grating shearing interferometer used by the method comprising: a light source and illumination system, a one-dimensional diffraction grating plate, a first three-dimensional stage, a two-dimensional diffraction grating plate, a second three-dimensional stage, a two-dimensional photoelectric sensor and a computing unit. The light source and the illumination system output spatially incoherent light, the one-dimensional diffraction grating plate is fixed on the first three-dimensional stage, the two-dimensional diffraction grating plate is fixed on the second three-dimensional stage, the one-dimensional diffraction grating plate comprises two sets of linear gratings with 50% duty-cycle, the two-dimensional diffraction grating plate comprises a set of checkerboard grating, and the two-dimensional photoelectric sensor is connected with the computing unit; establish xyz coordinate, where, the Z axis direction of the coordinate is along the optical axis direction of the system, the X axis direction of the coordinate is along the grating line direction of the linear grating 102 on the one-dimensional diffraction grating plate, the Y axis direction of the coordinate is along the grating line direction of the linear grating 101 on the one-dimensional diffraction grating plate, and set the motion axes of the first three-dimensional stage and the second three-dimensional stage as X axis, Y axis and Z axis respectively; the method includes the following steps:

(1) the optical imaging system to be tested is placed in the grating shearing interferometer, the light source and the illumination system are located on the object side of the optical imaging system to be tested, and the two-dimensional diffraction grating plate is located on the image side of the optical imaging system to be tested; the first three-dimensional stage is adjusted so that the one-dimensional diffraction grating plate is located on the object plane of the imaging system to be tested; the second three-dimensional stage is adjusted so that the two-dimensional diffraction grating plate is located on the object plane of the imaging system to be tested;

(2) the phase-shifting amounts are determined according to the shear ratio s of the grating shearing interference system: first, the maximum diffraction order is determined as $$m = \text{ceil}\left(\frac{1}{s}\right) - 1,$$

and the diffraction orders of the grating shearing interferometer system are in turn as follows: ±1, ±3, . . . , ±(2n−1), where n is the total number of positive high-order diffraction beams or the negative high-order diffraction beams in the shearing interferometer system, $$n = \text{fix}\left(\frac{m+1}{2}\right),$$

the function ceil(X) returns the smallest integer greater than or equal to X, and the function fix(X) returns the biggest integer less than or equal to X; then, the number N of moving steps of the two-dimensional diffraction grating plate when the interferogram is acquired is determined according to n, N=2 (n+1), and a movement of the two-dimensional diffraction grating plate is determined as $$\frac{i}{N}$$

checkerboard grating period (i=0, 1, 2 . . . N−1);

(3) the first three-dimensional stage is moved so that the first grating along the Y axis direction of the grating line on the one-dimensional grating diffraction plate is moved to the position of object side field of the optical imaging system to be tested; the second three-dimensional stage is moved so that the checkerboard grating on the two-dimensional diffraction plate is moved to the position of image side field of the imaging system to be tested, and the diagonal direction of the square is along the X axis direction or Y axis direction;

(4) moving the second three-dimensional stage along the X axis direction according to the aboved mentioned $$\frac{i}{N}$$

checkerboard grating period (i=0, 1, 2 . . . N−1). After each movement, the two-dimensional photoelectric sensor acquires a interferogram $$I_x\left(\frac{i}{N}\right),$$

transmits it to the data processing unit, and obtains a total of N interferograms. Performing Fourier transform on the light intensity of each position in $$I_x\left(\frac{i}{N}\right): I_x(w) = FFT\left(I_x\left(\frac{i}{N}\right)\right) \quad (1)$$

calculating the argument of $I_x(w)$ component when diagonal frequency of frequency domain is $2\pi$ according to formula (2), and the gradient phase $\varphi_x$ of the X axis direction is obtained:

$$\varphi_x = \text{angle}(I_x(w=2\pi)) \quad (2)$$

Wherein the function angle (X) returns the phase angle of a complex element X.

(5) the first three-dimensional stage is moved so that the second grating along the X axis direction of the grating line on the one-dimensional grating diffraction plate is moved to the position of object side field of the optical imaging system to be tested; performing the same movement of the second three-dimensional stage along the Y axis direction. After each movement, the two-dimensional photoelectric sensor acquires a interferogram $$I_y\left(\frac{i}{N}\right),$$

transmits it to the data processing unit, and obtains a total of N interferograms. Performing Fourier transform on the light intensity of each position in $$I_y\left(\frac{i}{N}\right): I_y(w) = FFT\left(I_y\left(\frac{i}{N}\right)\right) \quad (3)$$

calculating the argument of $I_x(w)$ component when diagonal frequency of frequency domain is $2\pi$, and the gradient phase $\varphi_y$ of the Y axis direction is obtained:

$$\varphi_y = \text{angle}(I_y(w=2\pi)) \quad (4)$$

(6) by unwrapping the gradient phase $\varphi_x$ of the X axis direction and the gradient phase $\varphi_y$ of the Y axis direction, the differential wavefront $\Delta W_x$ of the X axis direction and the differential wavefront $\Delta W_y$ of the Y axis direction are respectively obtained. The wavefront reconstruction algorithm of shearing interference is used to obtain the wavefront aberration of the optical imaging system to be tested.

In the method for wavefront measurement of optical imaging system based on grating shearing interferometry of the present invention, the period of the one-dimensional grating on the one-dimensional diffraction grating plate is the period of the checkerboard grating on the two-dimensional diffraction grating plate times a magnification of the optical imaging system to be tested.

The technical effect of the present invention is that the phase shift between the high-order diffraction beams and the 0th-order beam is realized by moving the two-dimensional grating diffraction plate located on the image plane, and the interference of these high diffraction orders can be eliminated by the phase-shifting algorithm. The precise phase retrieval is achieved, and the accuracy of the wavefront measurement of the optical imaging system to be tested is improved.

Reference numbers in the figures refer to the following structures: 1-one-dimensional diffraction grating plate; 2-first three-dimensional stage; 3-the optical imaging system to be tested; 4-two-dimensional diffraction grating plate; 5-second three-dimensional stage; 6-two-dimensional photoelectric sensor; 7-computing unit; 8-light source and illumination system.

DETAILED DESCRIPTIONS OF THE INVENTION AND EMBODIMENTS

In combination with the figures and the embodiment hereunder, the present invention will be described in detail, but the protection scope of the present invention is not limited to the figures and the embodiment described below.

Figure 1:
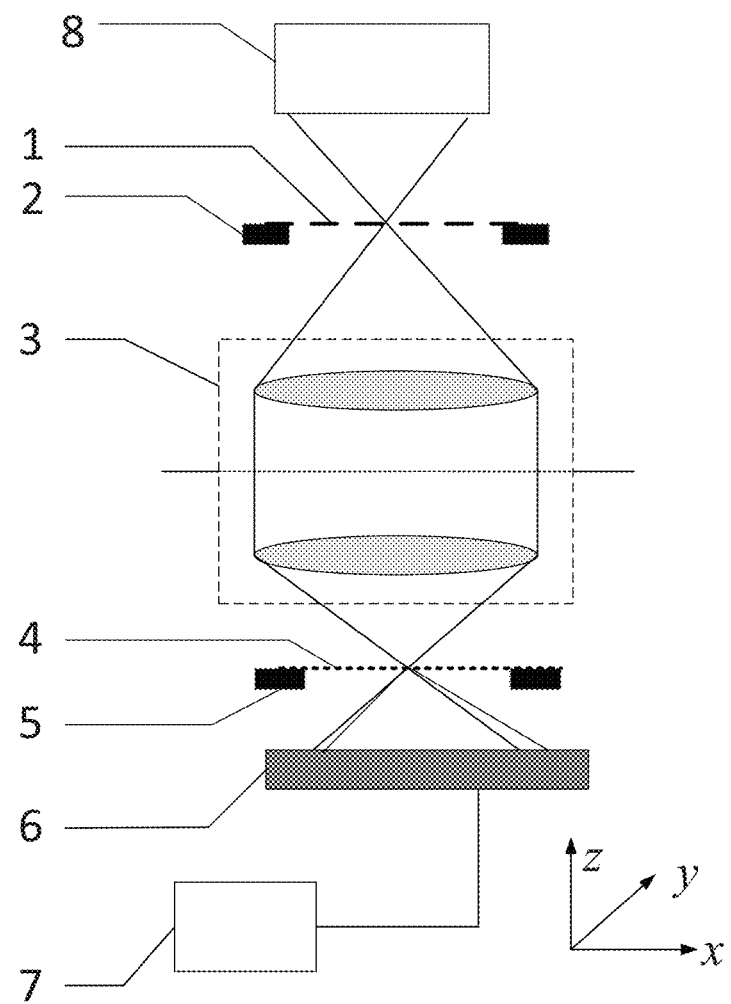
FIG. 1 is a schematic of the detection device of the wavefront measurement for grating shearing interferometer.

The grating shearing interferometer system used by the method for wavefront measurement of optical imaging system based on grating shearing interferometry disclosed in the present invention is shown in FIG. 1, and the system comprises a light source and illumination system 8, a one-dimensional diffraction grating plate 1, a first three-dimensional stage 2, a two-dimensional diffraction grating plate 4, a second three-dimensional stage 5, a two-dimensional photoelectric sensor 6, and a computing unit 7. The light source and the illumination system 8 output spatially incoherent light, the one-dimensional diffraction grating plate 1 is fixed on the first three-dimensional stage 2, the two-dimensional diffraction grating plate 4 is fixed on the second three-dimensional stage 5, and the output of the two-dimensional photoelectric sensor 6 is connected with the computing unit 7.

The xyz coordinate is established as follows. The Z axis direction of the coordinate is along the optical axis direction of the system. The X axis direction of the coordinate is along the grating line direction of the linear grating 102 on the one-dimensional diffraction grating plate 1. The Y axis direction of the coordinate is along the grating line direction of the linear grating 101 on the one-dimensional diffraction grating plate 1. The motion axes of the first three-dimensional stage 2 and the second three-dimensional stage 5 are set as X axis, Y axis, and Z axis, respectively.

The first three-dimensional stage 2 is used to move the two linear gratings 101 and 102 on the first diffraction plate 1 to the center of the object side view of the optical imaging system to be tested 3.

The second three-dimensional stage 5 is used to move the checkerboard grating on the second diffraction plate 4 to the center of the image side view of the optical imaging system to be tested 3, and perform specific movement along X axis direction and Y axis direction of the two-dimensional diffraction grating plate 4.

The two-dimensional photoelectric sensor 6 is a charge coupled device CCD or a CMOS sensor, and the detecting surface receives shearing interference fringes generated by diffraction orders of the checkerboard grating.

The computing unit 7 is used to collect and store interferograms, and perform process and analyze of the interferograms.

Figure 2:
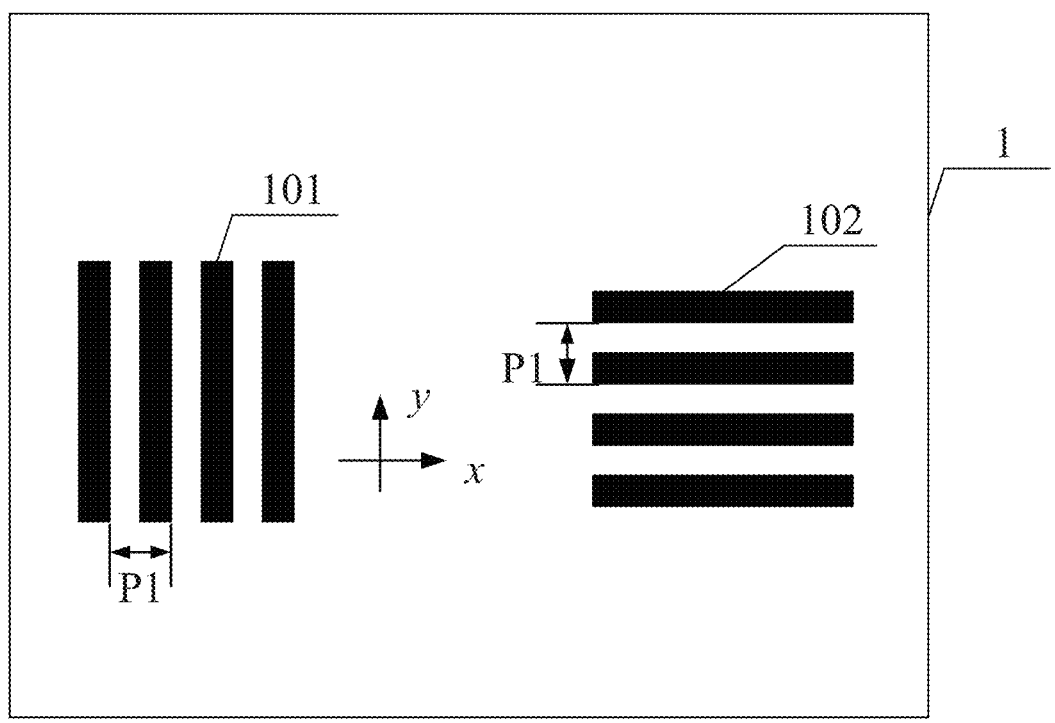
FIG. 2 is a schematic of the one-dimensional diffraction grating plate.

FIG. 2 is a schematic of the one-dimensional diffraction grating plate 1, including two linear diffraction gratings, which are the first grating 101 along Y axis direction of the grating line and the second grating 102 along X axis direction of the grating line, respectively. The period of the linear diffraction grating is P1, and the duty-cycle is 50%.

The first grating 101 and the second grating 102 are phase gratings or amplitude gratings.

Figure 3:
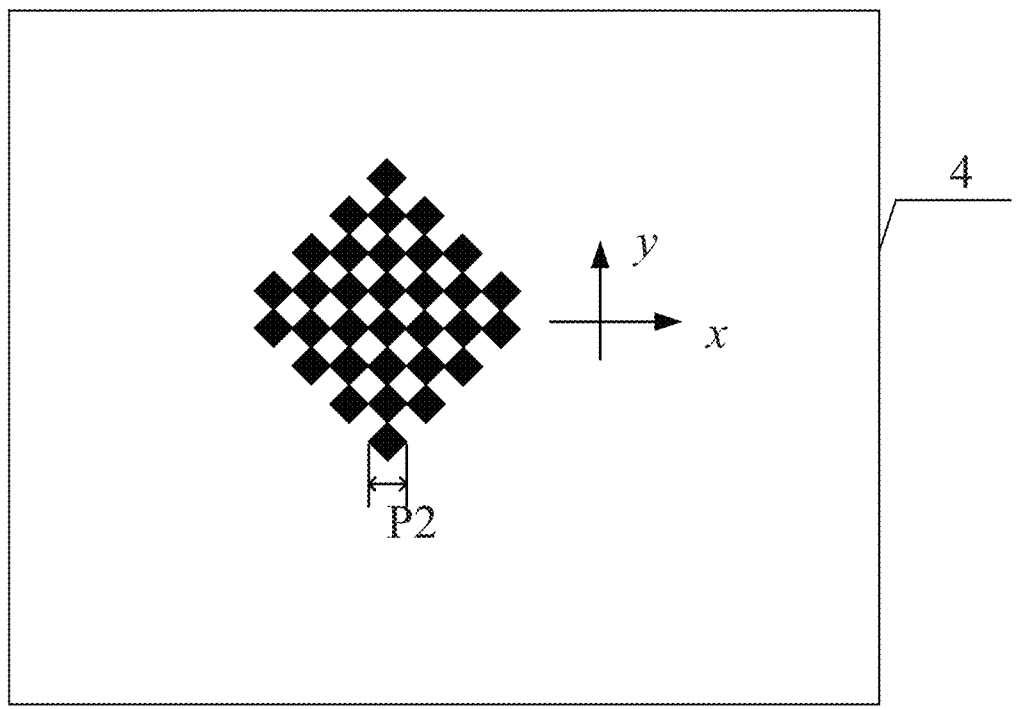
FIG. 3 is a schematic of the two-dimensional diffraction grating plate.

FIG. 3 is a schematic of the two-dimensional diffraction grating plate 4, which is a checkerboard grating with a period of P2 and a 50% duty-cycle. The checkerboard grating is composed of a square grid, and the diagonal direction of the square is along the X axis direction or Y axis direction.

The checkerboard grating is a phase grating or an amplitude grating.

The period of the linear grating P1 and the period of the chenckerboard grating P2 satisfy the following formula:

$$P1 = M \cdot P2 \tag{1},$$

wherein M is a magnification of the optical imaging system to be tested 3.

Figure 4:
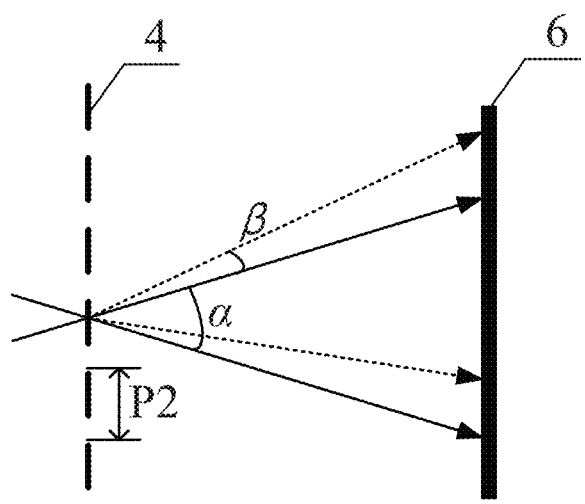
FIG. 4 is a schematic showing the relationship between the shear ratio s of the grating shearing interferometer system and the numerical aperture N.A.

FIG. 4 is a schematic showing the relationship between the shear ratio s of the shearing interferometer system, the numerical aperture NA of the optical imaging system to be tested 3, and the period of the checkerboard grating P2. The shear ratio s is defined as the ratio of the diffraction angle to the angle with full aperture:

$$s = \frac{\beta}{\alpha} = \frac{\arcsin\left(\frac{\lambda}{P2}\right)}{2ars\ \sin(NA)}, \tag{2}$$

wherein $\beta$ is the diffraction angle of the 1st-order diffraction beam, and a is the angle with full aperture of the beam.

Based on the grating shearing interference system described above, only high-order diffraction wavefront with odd-order is generated after passing through the checkerboard grating of the two-dimensional grating diffraction plate 4. Combining with the first linear grating 101 or the second linear grating 102 on the object side of the one-dimensional grating diffraction plate 1, the spatial coherence of the light field is modulated such that there is only interference between the 0th-order beam and other high diffraction orders in the light field, and there is no interference between these high diffraction orders. The interference field received by the two-dimensional photoelectric sensor 6 can then be described as:

$$I(x, y) = A_0^2 + \sum_{m=-(2n+1)}^{m=2n+1} A_n^2 + \cdots + \tag{3}$$

$$2 \sum_{m=-(2n+1)}^{m=2n+1} A_0 A_m \gamma_m \cos[\phi(x, y) - \phi(x - m\Delta, y) - \alpha_m],$$

$$(n = 0, 1, 2, \cdots),$$

Wherein $A_0$ is the amplitude of the 0th-order beam, $A_m$ is the amplitude of the mth-order diffraction beam, $\alpha_m$ is the optical path difference between the mth-order diffraction beam and the 0-order beam, $\varphi(x,y)$ is the wavefront to be measured, $\gamma_m$ is the degree of coherence between the mth-order diffraction beam and the 0th-order beam, m is the diffraction order, and $\Delta$ is the offset of the 1st-order diffraction beam relative to the 0th-order beam.

Assuming $A_0$ is 1, the $A_m$ and $\gamma_m$ coefficients satisfy the following relationship:

$$A_m = \gamma_m = \frac{2}{m\pi} \quad (4)$$

For small shear conditions, the phase between ±1st-order beams and 0th-order beam is as follows:

$$\cos[\varphi(x,y)-\varphi(x-\Delta,y)]+\cos[\varphi(x,y)-\varphi(x+\Delta,y)] \approx 2\cos(d\varphi \cdot \Delta)$$

Let $d\varphi \cdot \Delta = \varphi$, $\varphi_m = \varphi(x,y) - \varphi(x+m\Delta, y)$, then formula (3) can be further simplified as:

$$I = I0 + a_1 \cos\varphi + \sum_{m=3}^{m=2n-1} a_m(\cos\varphi_{-m} + \cos\varphi_m), (n = 2, 3...) \quad (5)$$

Where, $$I0 = A_0^2 + \sum_{m=-(2n+1)}^{m=2n+1} A_n^2,$$

$\alpha_1 = 4A_0 A_1 \gamma_1$, $\alpha_m = 2A_0 A_m \gamma_m$. When a phase shift $\delta$ is introduced, the above equation can be described as:

$$I = I0 + a_1 \cos(\varphi+\delta) + \sum_{m=3}^{m=2n-1} a_m(\cos(\varphi_{-m} - m\delta) + \cos(\varphi_m + m\delta)) \quad (6)$$

The method for wavefront measurement of optical imaging system using the aboved described grating shearing interferometer of the present invention includes the following steps:

(1) the optical imaging system to be tested 3 is placed in the grating shearing interferometer, the light source and the illumination system 8 are located on the object side of the optical imaging system to be tested 3, and the two-dimensional diffraction grating plate 4 is located on the image side of the optical imaging system to be tested 3; the first three-dimensional stage 2 is adjusted so that the one-dimensional diffraction grating plate 1 is located on the object plane of the imaging system 3 to be tested; the second three-dimensional stage 5 is adjusted so that the two-dimensional diffraction grating plate 4 is located on the object plane of the imaging system to be tested 3;

(2) the phase-shifting amounts are determined according to the shear ratio s of the grating shearing interferometer: first, the maximum diffraction order is determined as $$m = \text{ceil}\left(\frac{1}{s}\right) - 1,$$

and the diffraction order of the grating shearing interferometer system is in turn as follows: ±1, ±3, ..., ±(2n−1), where n is the total number of positive high-order diffraction beams or the negative high-order diffraction beams in the shearing interferometer system, $$n = \text{fix}\left(\frac{m+1}{2}\right),$$

the function ceil(X) returns the smallest integer greater than or equal to X, and the function fix(X) returns the biggest integer less than or equal to X; then, the number N of moving steps of the two-dimensional diffraction grating plate 4 when the interferogram is acquired is determined according to n, N=2(n+1), and the movement is determined as $$\frac{i}{N}$$

checkerboard grating period (i=0, 1, 2 ... N−1);

(3) the first three-dimensional stage 2 is moved so that the first grating 101 along the Y axis direction of the grating line on the one-dimensional grating diffraction plate 1 is moved into the position of object side field of the optical imaging system to be tested 3; the second three-dimensional stage 5 is moved so that the checkerboard grating on the two-dimensional diffraction plate 4 is moved to the position of image side field of the imaging system to be tested 3, and the diagonal direction of the square is along the X axis direction or Y axis direction;

(4) moving the second three-dimensional stage 5 along the X axis direction according to the aboved mentioned $$\frac{i}{N}$$

checkerboard grating period (i=0, 1, 2 ... N−1). After each movement, the two-dimensional photoelectric sensor 6 acquires a interferogram $$I_x\left(\frac{i}{N}\right),$$

transmits it to the data processing unit 7, and obtains a total of N shearing interferograms; performing Fourier transform on the light intensity of each position in $$I_x\left(\frac{i}{N}\right): I_x(w) = FFT\left(I_x\left(\frac{i}{N}\right)\right), \quad (7)$$

calculating the argument of $I_x(w)$ component when diagonal frequency of frequency domain is $2\pi$ according to formula (8), and the gradient phase $\varphi_x$ of the X axis direction is obtained:

$$\varphi_x \text{angle}(I_x(w=2\pi)) \quad (8),$$

wherein the function angle (X) returns the phase angle of a complex element X.

(5) the first three-dimensional stage 2 is moved so that the second grating 102 along the X axis direction of the grating line on the one-dimensional grating diffraction plate 1 is moved to the position of object side field of the optical imaging system to be tested 3; performing the same movement of the second three-dimensional stage 5 along the Y axis direction; after each movement, the two-dimensional photoelectric sensor 6 acquires a interferogram, $$I_y\left(\frac{i}{N}\right),$$

transmits it to the data processing unit 7, and obtains a total of N interferograms; performing Fourier transform on the light intensity of each position in $$I_y\left(\frac{i}{N}\right): I_y(w) = FFT\left(I_y\left(\frac{i}{N}\right)\right), \quad (9)$$

calculating the argument of $I_x(w)$ component when diagonal frequency of frequency domain is $2\pi$, and the gradient phase $\varphi_y$ of the Y axis direction is obtained:

$$\varphi_y = \text{angle}(I_y(w=2\pi)) \quad (10);$$

(6) by unwrapping the gradient phase $\varphi_x$ of the X axis direction and the gradient phase $\varphi_y$ of the Y axis direction, the differential wavefront $\Delta W_x$ of the X axis direction and the differential wavefront $\Delta W_y$ of the Y axis direction are respectively obtained. The wavefront reconstruction algorithm of shearing interference is used to obtain the wavefront aberration of the optical imaging system to be tested 3.

The method of the present invention has the advantages of high precision, large measurable range of numerical aperture, and adjustable shear rate of the grating interferometer.

We claim:

1. A method for wavefront measurement of an optical imaging system based on a grating shearing interferometry, comprising:

(a) placing an optical imaging system (3) in a grating shearing interferometer system, the optical imaging system (3) is defined by an object side and an image side and a magnification, wherein an object plane is on the object side and perpendicular to an optical axis of the optical imaging system (3), and an image plane is on the image side and perpendicular to the optical axis of the optical imaging system (3), and the grating shearing interferometer system comprises an illumination system (8), wherein the illumination system (8) outputs spatial incoherent light in a direction of an optical axis of the grating shearing interferometer system, a one-dimensional diffraction grating plate (1) fixed on a first three-dimensional stage (2) and comprising a first set of linear gratings (101) and a second set of linear gratings (102), and duty-cycle of one-dimensional diffraction grating is 50%, the first three-dimensional stage (2) for moving the one-dimensional diffraction grating plate (1), a two-dimensional diffraction grating plate (4) fixed on a second three-dimensional stage (5) and comprising a set of checkerboard gratings, and each of the checkerboard grating is square-shaped with a diagonal line, the second three-dimensional stage (5) for moving the two-dimensional diffraction grating plate (4), a two-dimensional photoelectric sensor (6) being connected with and sending outputs to a data processing unit (7), and the data processing unit (7) being connected with and receiving outputs of the two-dimensional photoelectric sensor (6), establishing an xyz coordinate axis system of the grating shearing interferometer system by setting motion axes of the first three-dimensional stage (2) and the second three-dimensional stage (5) as X axis, Y axis, and Z axis, respectively, wherein direction of the Z axis is along the direction of the optical axis of the grating shearing interferometer system, direction of the X axis is along the direction of the grating line of the second set of linear gratings (102) on the one-dimensional diffraction grating plate (1), and direction of the Y axis is along the direction of the grating line of the first set of linear gratings (101) on the one-dimensional diffraction grating plate (1), wherein the illumination system (8) is located on the object side of the optical imaging system (3), and the two-dimensional diffraction grating plate (4) is located on the image side of the optical imaging system (3);

adjusting the first three-dimensional stage (2) to locate the one-dimensional diffraction grating plate (1) on the object plane of the optical imaging system (3);

adjusting the second three-dimensional stage (5) to locate the two-dimensional diffraction grating plate (4) on the image plane of the optical imaging system (3);

(b) determining number of phase-shifting moving steps N of the two-dimensional diffraction grating plate (4) by the following steps of determining $$m = \text{ceil}\left(\frac{1}{s}\right) - 1,$$

maximum diffraction order m according to formula wherein s is shear ratio $$\text{ceil}\left(\frac{1}{s}\right)$$

of the grating shearing interferometer system, and equals to $(1/s)$ when $(1/s)$ is an integer, $$\text{ceil}\left(\frac{1}{s}\right)$$

or is an immediate next positive integer that is greater than $(1/s)$ when $(1/s)$ is not an integer, determining total number n of positive high-order and negative low-order diffraction beams in the grating shearing interferometer system according to formula $$n = \text{fix}\left(\frac{m+1}{2}\right),$$

wherein n equals to $[(m+1)/2]$ when $[(m+1)/2]$ is an integer, or n is an immediate next positive integer that is less than $[(m+1)/2]$ when $[(m+1)/2]$ is not an integer, determining diffraction order based on the total number n of the positive high-order and negative low-order diffraction beams as follows: ±1, ±3, . . . , ±(2n−1), determining number N of phase-shifting moving steps of the two-dimensional diffraction grating plate (4) for acquiring interferograms according to formula N=2 (n+1), and determining period of movement of the two-dimensional diffraction grating plate (4)

$$\frac{i}{N}$$

which is times the period of the set of checkerboard gratings, wherein i is an integer that is 0, 1, 2, . . . (N-1);

(c) moving the first three-dimensional stage (2) so that the first set of linear gratings (101) on the one-dimensional grating diffraction plate (1) are moved along the Y axis direction to a position in a field of view on the object side of the optical imaging system (3);

moving the second three-dimensional stage (5) so that the set of checkerboard gratings on the two-dimensional diffraction plate (4) are moved to a position in a field of view on the image side of the optical imaging system (3), and direction of the diagonal line in each square of the checkerboard gratings is along the X axis direction or Y axis direction;

(d) moving the second three-dimensional stage (5) along direction of the X axis $$\frac{i}{N}$$

direction according to the period of movement which is times the period of the set of checkerboard gratings, wherein i is an integer that is 0, 1, 2, . . . (N-1)

$$I_x\left(\frac{i}{N}\right)$$

acquiring an interferogram by the two-dimensional photoelectric sensor (6) after each movement and transmitting the interferograms to the data processing unit (7);

obtaining a total number of N interferograms and performing Fourier transform on light intensity of each position corresponding to each of the N numbers of the interferograms in $$I_x\left(\frac{i}{N}\right)$$

as in formula (i):

$$I_x(w) = FFT\left(I_x\left(\frac{i}{N}\right)\right); \quad (i)$$

(i); and calculating argument of $I_x(w)$ component when diagonal frequency of frequency domain is $2\pi$ and obtaining a gradient phase $\varphi_x$ of the X axis direction according to formula (ii): $\varphi_x$=angle ($I_x$ (w=2π)) (ii), wherein $\varphi_x$ is the phase angle function of complex element $I_x$ (w);

(e) moving the first three-dimensional stage (2) so that the second set of linear gratings (102) on the one-dimensional grating diffraction plate (1) are moved along the X axis direction to a position in the field of view on the object side of the optical imaging system;

moving the second three-dimensional stage (5)

$$\frac{i}{N}$$

along the direction of the Y axis according to the period of movement which is times the period of the set of checkerboard gratings, wherein i is an integer that is 0, 1, 2, . . . (N-1), $$I_y\left(\frac{i}{N}\right)$$

acquiring an interferogram by the two-dimensional photoelectric sensor (6) after each movement, transmitting the interferograms to the data processing unit (7), and obtaining a total of N numbers of shearing interferograms;

performing Fourier transform on a light intensity of each position corresponding to each $$I_y\left(\frac{i}{N}\right)$$

of the N numbers of the shearing interferograms in according to formula (iii):

$$I_y(w) = FFT\left(I_y\left(\frac{i}{N}\right)\right), \quad (iii)$$

(iii), calculating argument of $I_y(w)$ component when diagonal frequency w of frequency domain is $2\pi$, and obtaining a gradient phase $\varphi_y$ of the Y axis direction according to formula (iv): $\varphi_y$=angle($I_y$ (w=2π)) (iv), wherein $\varphi_y$ is the phase angle function of complex element $I_y(w)$; and (f) unwrapping the gradient phase $\varphi_x$ of the X axis direction to obtain differential wavefront $\Delta W_x$ of the X axis direction, unwrapping the gradient phase $\varphi_y$ of the Y axis direction to obtain differential wavefront $\Delta W_y$ of the Y axis direction, and obtaining wavefront aberration W of the optical imaging system (3) by wavefront reconstruction algorithm of the grating shearing interferometer system.

2. The method for wavefront measurement of the optical imaging system based on grating shearing interferometry of claim 1, wherein a period of the first set of linear gratings (101) and the second set of linear gratings (102) on the one-dimensional diffraction grating plate (1) is determined by multiplying the period of the set of checkerboard gratings on the two-dimensional diffraction grating plate (4) with the magnification of the optical imaging system (3).

* * * * *